United States Patent
Narathong et al.

(10) Patent No.: US 8,099,127 B2
(45) Date of Patent: Jan. 17, 2012

(54) MULTI-MODE CONFIGURABLE TRANSMITTER CIRCUIT

(75) Inventors: Chiewcharn Narathong, Laguna Niguel, CA (US); Sankaran Aniruddhan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 770 days.

(21) Appl. No.: 12/184,341

(22) Filed: Aug. 1, 2008

(65) Prior Publication Data

US 2010/0029227 A1 Feb. 4, 2010

(51) Int. Cl.
*H04M 1/00* (2006.01)
*H04B 1/04* (2006.01)

(52) U.S. Cl. ............... 455/552.1; 455/127.3; 455/115.1

(58) Field of Classification Search ............ 455/333, 455/127.3, 194.2, 253.2, 341, 550.1, 552.1, 455/115.1; 330/51, 133, 134, 150, 151
See application file for complete search history.

(56) References Cited

U.S. PATENT DOCUMENTS

| | | | |
|---|---|---|---|
| 5,438,683 A * | 8/1995 | Durtler et al. | 455/74 |
| 6,313,698 B1 * | 11/2001 | Zhang et al. | 330/51 |
| 7,427,894 B2 * | 9/2008 | Dow et al. | 330/51 |
| 7,863,986 B2 * | 1/2011 | Narathong et al. | 330/301 |
| 2010/0120369 A1 * | 5/2010 | Ko et al. | 455/67.11 |
| 2010/0130144 A1 * | 5/2010 | Narathong et al. | 455/114.2 |

FOREIGN PATENT DOCUMENTS

| | | |
|---|---|---|
| EP | 0977354 A1 | 2/2000 |
| EP | 1032120 A2 | 8/2000 |
| GB | 2219702 A | 12/1989 |
| WO | WO9636105 A1 | 11/1996 |
| WO | WO0122604 | 3/2001 |

OTHER PUBLICATIONS

International Search Report and Written Opinion—PCT/US2009/052579—ISAEPO—Feb. 24, 2010.

* cited by examiner

*Primary Examiner* — Sonny Trinh
(74) *Attorney, Agent, or Firm* — Jonathan T. Velasco; Eric Ho

(57) ABSTRACT

Method and apparatus for configuring a transmitter circuit to support multiple modes and/or frequency bands. In an embodiment, a pre-driver amplifier (pDA) in a transmit (TX) signal path is selectively bypassed by a controllable switch. The switch can be controlled based on a mode of operation of the transmitter circuit. Further techniques are disclosed for selectively coupling the output of a driver amplifier (DA) to at least one of a plurality of off-chip connections, each connection coupling the DA output to a set of off-chip components.

48 Claims, 10 Drawing Sheets

| Setting | A1 | pDA EN | C1/C2/C3/C4 | Description | Example mode |
|---|---|---|---|---|---|
| ① | LO | HI | HI/LO/LO/LO | pDA active, external SAW filter SAW1, power amplifier PA1 | WCDMA @ 900 MHz |
| ② | HI | LO | LO/HI/LO/LO | No pDA, external SAW filter SAW 2, power amplifier PA2 | CDMA 1x / LTE @ 700 MHz |
| ③ | HI | LO | LO/LO/HI/LO | No pDA, no external SAW filter, power amplifier PA3 | GSM / EDGE |
| ④ | HI | LO | LO/LO/HI/LO | No pDA, no external SAW filter, power amplifier PA4 | CDMA 1x |
| ⑤ | LO | HI | LO/LO/LO/HI | pDA active, no external SAW filter, power amplifier PA5 | WCDMA @ PCS |

FIG. 4

MULTI-MODE CONFIGURABLE TRANSMITTER CIRCUIT

TECHNICAL FIELD

The disclosure relates to integrated circuits (IC's), and more specifically, to techniques for designing a multi-mode configurable transmitter circuit.

BACKGROUND

Modern wireless communications devices often support signal transmission and reception over multiple frequency ranges or "bands," using one of several distinct communications protocols or standards. For example, a single cellular phone may be required to communicate using any or all of the WCDMA, CDMA, GSM, EDGE, and LTE standards for cellular telephony, over any of several frequency bands allotted to such communications by a cellular service provider.

The radio-frequency (RF) circuitry supporting each mode and frequency band typically must satisfy different, oftentimes conflicting, design constraints. For example, in GSM, the output power requirement for the transmit circuitry is relatively high, and the out-of-band spurious emissions requirement is relatively stringent. However, the peak-to-average ratio (PAR) of a GSM signal is relatively low, so a high degree of linearity is not demanded from the transmitter circuitry. On the other hand, the PAR of a WCDMA signal is relatively high, mandating a transmitter having a high degree of linearity.

To accommodate different RF requirements of the various standards and frequency bands supported by a device, multiple transmit (TX) signal paths are often provided in the same device, each signal path designed for a specific standard/frequency band. This requires that certain component circuitry, such as TX filters and amplifiers, be replicated multiple times in a single device, leading to higher die area and higher cost. It would be desirable to have techniques for providing a wireless communications device that can flexibly operate according to multiple standards and/or frequency bands while avoiding unnecessary replication of component circuitry.

SUMMARY

An aspect of the present disclosure provides a method for configuring a transmitter for a communications device, the method comprising providing a transmit (TX) signal to the input of a pre-driver amplifier (pDA), the pDA having a pDA output, the pDA selectively turned on and off by a pDA control signal; coupling the pDA output to the input of a driver amplifier (DA), the DA having a DA output; providing a bypass switch shunting the pDA input and the pDA output, the bypass switch controlled by a bypass control signal; during a first mode of operation, setting the bypass control signal to turn on the bypass switch, and setting the pDA control signal to turn off the pDA; and during a second mode of operation, setting the bypass control signal to turn off the bypass switch, and setting the pDA control signal to turn on the pDA.

Another aspect of the present disclosure provides a transmitter apparatus for a communications device, the apparatus comprising: a pre-driver amplifier (pDA) having a pDA input coupled to a transmit (TX) signal, the pDA having a pDA output, the pDA selectively turned on and off by a pDA control signal; a driver amplifier (DA) having a DA input coupled to the pDA output, the DA having a DA output; a bypass switch shunting the pDA input and the pDA output, the bypass switch controlled by a bypass control signal, the bypass control signal configured to, during a first mode of operation, set the bypass control signal to turn on the bypass switch and turn off the pDA, and to, during a second mode of operation, set the bypass control signal to turn, off the bypass switch and turn on the pDA.

Yet another aspect of the present disclosure provides a transmitter apparatus for a communications device, the apparatus comprising: a pre-driver amplifier (pDA) having a pDA input coupled to a transmit (TX) signal, the pDA having a pDA output, the pDA selectively turned on and off by a pDA control signal; a driver amplifier (DA) having a DA input coupled to the pDA output, the DA having a DA output; and means for bypassing the pDA and turning off the PDA during a first mode of operation, and not bypassing the pDA and turning on the PDA during a second mode of operation.

Yet another aspect of the present disclosure provides a method for configuring a transmitter for a communications device, the method comprising: providing a transmit (TX) signal to the input of a driver amplifier (DA), the DA having a DA output; coupling the DA output to a plurality of selectable off-chip connections, each off-chip connection coupling the DA output to a set of off-chip components, each off-chip connection comprising a corresponding off-chip connection switch coupling the DA output to the corresponding off-chip connection; and enabling at least one of the plurality of selectable off-chip connections based on an off-chip connection control signal.

Yet another aspect of the present disclosure provides a transmitter apparatus for a communications device, the apparatus comprising: a driver amplifier (DA) having a DA output; a plurality of selectable off-chip connections, each off-chip connection coupling the DA output to a set of off-chip components, each off-chip connection comprising a corresponding off-chip connection switch coupling the DA output to the corresponding off-chip connection; and an off-chip connection control signal for turning on at least one of the plurality of selectable off-chip connections.

Yet another aspect of the present disclosure provides a transmitter apparatus for a communications device, the apparatus comprising: a driver amplifier (DA) having a DA output; and means for selectively coupling the DA output to one of a plurality of off-chip connections.

BRIEF DESCRIPTION OF DRAWINGS

FIG. 4 shows an example of possible configuration settings for the transmitter circuitry depicted in FIGS. 2 and 3.

DETAILED DESCRIPTION

Figure 1:
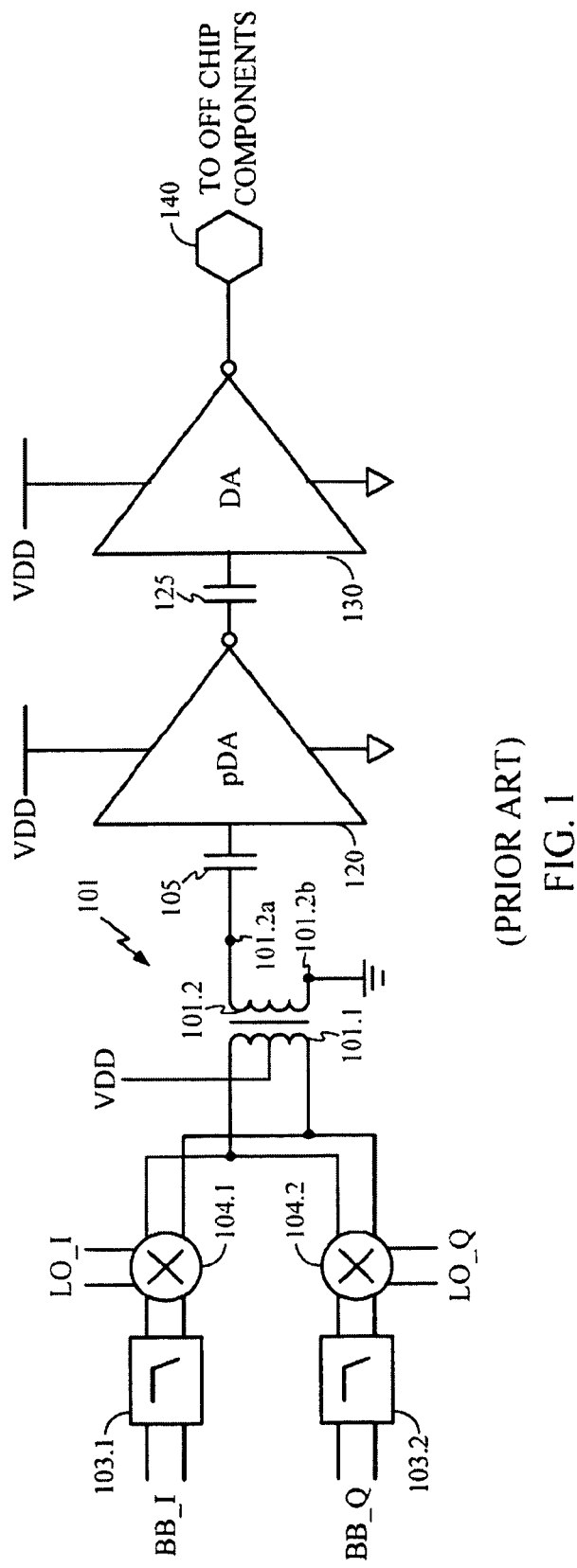
FIG. 1 depicts an implementation of a prior art transmitter (TX) signal path for a communications circuit.

FIG. 1 depicts an implementation of a prior art transmitter (TX) signal path for a communications circuit. In FIG. 1, baseband input signals BB_I (in-phase) and BB_Q (quadrature-phase) are provided to low-pass filters 103.1 and 103.2 The output signals of the low-pass filters are provided to mixers 104.1 and 104.2, which modulate the filtered baseband signals to a higher frequency by multiplying with local oscillator signals LO_I and LO_Q, respectively. The differential outputs of the mixers 104.1 and 104.2 are combined and coupled to a balun primary element 101.1 of balun 101. Balun 101 also includes a balun secondary element 101.2 electromagnetically coupled to the balun primary element 101J. The balun 101 functions to convert a differential signal across the balun primary element 101.1 to a single-ended signal at node 101.2a of the balun secondary element 101.2, wherein the other node 101.2b of the balun secondary element 301.2 is coupled to a ground voltage. In FIG. 1, the balun primary and secondary elements are shown as mutually coupled inductors, although the techniques of the present disclosure need not be limited to implementations of baluns as mutually coupled inductors.

In FIG. 1, the node 101.2a of the balun secondary element 101.2 is coupled to a pre-driver amplifier (pDA) 120, followed by a driver amplifier (DA) 130. In an embodiment, the output of the DA 130 may be used to drive a power amplifier (PA) and/or other off-chip components via off-chip connection 140. In an implementation, the output of the DA 130 may directly drive an off-chip antenna for over-the-air signal transmission, without an additional power amplification stage.

One of ordinary skill in the art will realize that an off-chip connection 140 may be implemented in a variety of ways, including as a pad, a bump, a pin, etc. The techniques of the present disclosure are not intended to be restricted to any particular implementation of an off-chip connection.

One of ordinary skill in the art will also realize that the components in the TX signal path of FIG. 1 are shown for illustrative purposes only, and that, a TX signal path may generally be implemented using any of a number of alternative architectures not shown. For example, a TX signal path may omit the balun element 101, and/or adopt additional filters and gain elements not shown. The techniques of the present disclosure are contemplated to be applicable to such alternative architectures not shown.

Figure 1A:
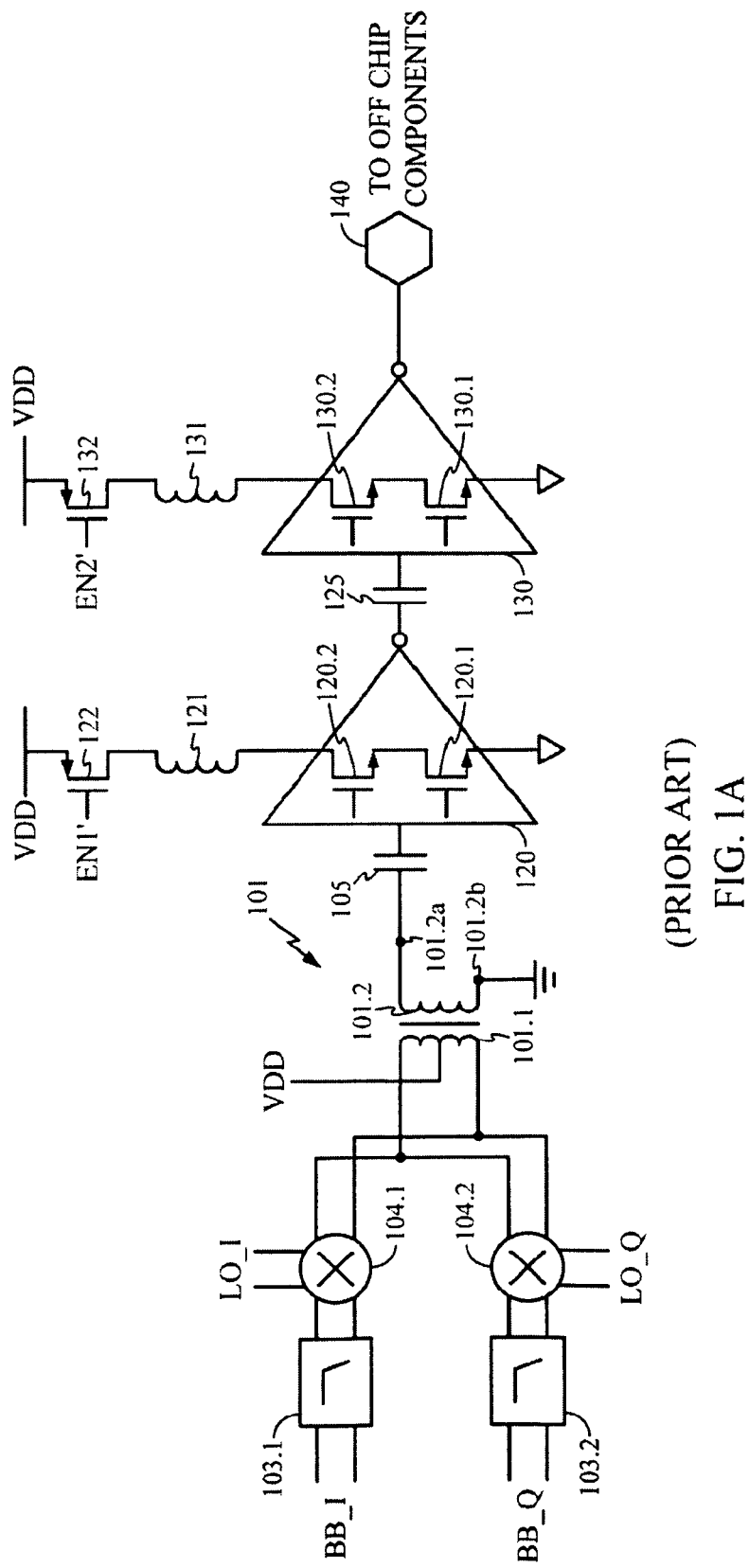
FIG. 1A depicts a specific implementation of a prior art TX signal path such as described with reference to FIG. 1.

FIG. 1A depicts a specific implementation of a transmitter wherein the pDA 120 includes a cascoded common-source open-drain amplifier, with NMOS transistors 120.1, and 120.2 forming the cascode amplification stage, inductor 121 forming the load at the drain of pDA 120, and a PMOS switch 122 coupled to control signal EN1' for selectively enabling or disabling the pDA 120. The output of the pDA 120 is AC-coupled to the input of the succeeding DA 130 via a capacitor 125.

In FIG. 1A, DA 130 is likewise implemented as a cascaded common-source open-drain amplifier, with NMOS transistors 130.1 and 130.2 forming the cascode amplification stage, inductor 131 forming the load at the drain of DA 130, and a PMOS switch 132 coupled to control signal EN2' for selectively enabling or disabling the DA 130. The output of the DA 130 is coupled to an off-chip connection 140 to deliver the amplified signal to an off-chip component, e.g., a surface acoustic wave (SAW) filter, or a power amplifier (PA).

Note the specific implementation of FIG. 1A is shown for illustrative purposes only, and is not meant to limit the techniques of the present disclosure to any particular circuitry shown. Alternative implementations could employ other circuit topologies for the pDA and DA, e.g., inverter-based amplifier architectures. Other mechanisms for selectively enabling the pDA and DA may also be employed, e.g., transistor switches coupled in series with either the pDA or the DA. In an embodiment (not shown), the pDA and DA may each be enabled or disabled by switching on or off, respectively, a bias voltage or current associated with each of transistors 120.1 and 130.1. Furthermore, the gate voltages of transistors 120.2 and 130.2 may be selectively coupled to VDD or ground to turn the cascoded amplifiers on or off, respectively. Applying such techniques may avoid the need for switches 122 and 132 in FIG. 1A, which might otherwise undesirably decrease the voltage swing available at the outputs of the amplifiers. Such alternative implementations are contemplated to be within the scope of the present disclosure.

One of ordinary skill in the art will realize that the gain of the pDA and the DA stages may generally be selected by, e.g., controlling the transistor device sizes and/or the amplifier bias currents.

In designs for certain wireless standards and/or frequency bands of operation, the specifications for allowable noise generated by the TX chain in a receive (RX) frequency band may be particularly stringent. This may be the case, for example, in some frequency bands used to support the WCDMA/CDMA (Wideband Code Division Multiple Access/Code Division Multiple Access) standards. In these cases, a wireless device's duplexer rejection in the RX band is often inadequate, and an external SAW filter in the TX signal path may be further required to adequately remove out-of-band noise generated by the TX circuitry in the RX frequency band.

Figure 1B:
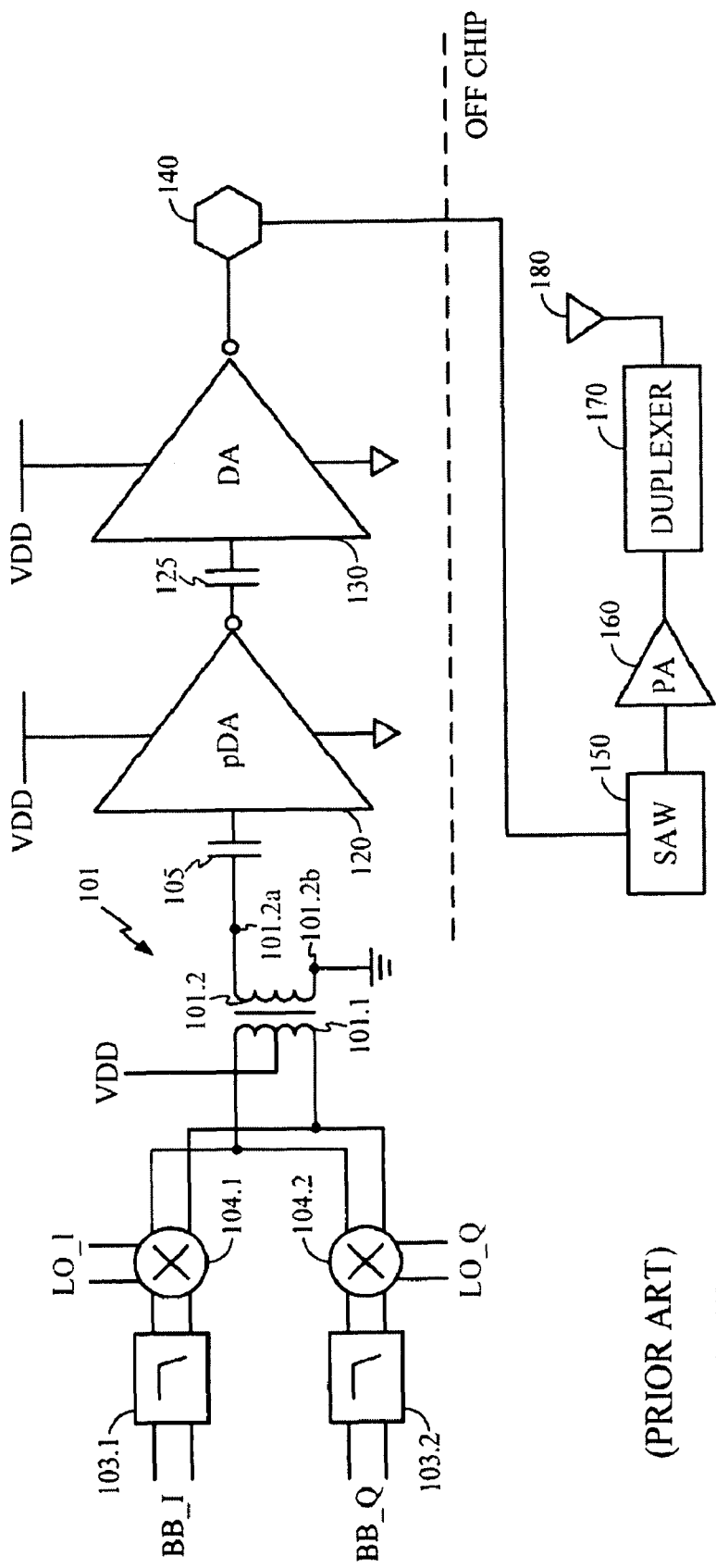
FIG. 1B depicts an implementation wherein the TX signal path of FIG. 1 is further coupled to a SAW filter 350 and a PA 160.

FIG. 1B depicts such an implementation utilizing an external SAW filter. In FIG. 1B, the TX signal path of FIG. 1 is further coupled to a SAW filter 150 and a PA 160. The PA 160 amplifies the TX signal prior to transmission over the air via duplexer 170 and antenna 180. The external SAW filter 150 acts to attenuate out-of-band emissions from the signal to be transmitted. The SAW filter 150 may be included in implementations wherein, e.g., the attenuation of the TX signal afforded in the RX frequency band by the duplexer 170 is inadequate.

In FIG. 1B, while the SAW filter 150 helps attenuate out-of-band emissions in the TX signal, it may also introduce unwanted attenuation to the in-band TX signal, in such cases, the pDA 120 can provide the additional gain to compensate for the in-band attenuation of the SAW filter 150. Note however that die pDA 120 may itself introduce unwanted nonlinear distortion and out-of-band noise to the TX signal.

Figure 1C:
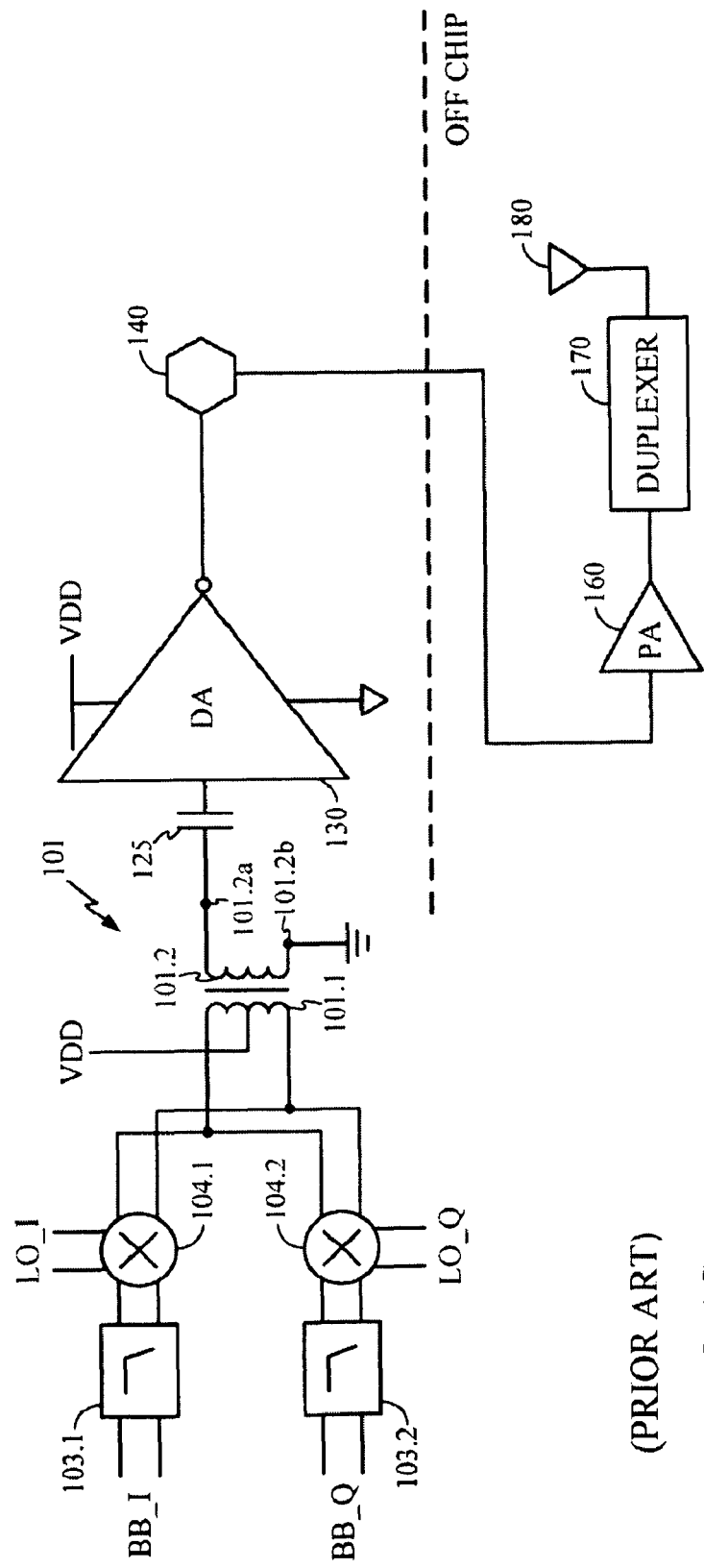
FIG. 1C depicts a TX signal path implementation wherein both the pDA and an external SAW filter are omitted.

In designs for certain alternative wireless standards and/or frequency bands of operation, the specifications for allowable noise generated by the TX chain in the RX frequency baud may be less stringent. This may be the case, for example, in certain frequency bands of the WCDMA/CDMA and/or GSM/EDGE standards, wherein a wireless device's duplexer rejection in the RX band is deemed adequate. In such designs, an external SAW filter 150 may be omitted to save cost, while the pDA may also be omitted, as the additional gain provided by the pDA is not required. FIG. 1C depicts a transmitter implementation for such an application, wherein the node 101.2a of the balun secondary element 101.2 is directly coupled to a DA 130 via capacitor 125, without first being coupled to a pDA.

To support roaming across multiple wireless standards and/or frequency bands, a transmitter circuit for a wireless device must be capable of meeting a plurality of alternative, possibly conflicting, design specifications, as described above. In particular, a transmitter circuit for one frequency band may require an external SAW filter and a pDA for adequate noise rejection and gain, while a transmitter circuit for another frequency band may require no external SAW filter and no pDA for adequate linearity and noise rejection, in the prior art, such a multi-band/multi-mode transmitter circuit is typically implemented by providing multiple instances of TX signal paths. For example, a single transmitter circuit may incorporate an instance of TX circuitry designed to support an external SAW filter, as depicted in FIG. 1B, in addition to an instance of TX circuitry designed to support no external SAW filter, as depicted in FIG. 1C, etc. While incorporating multiple instances of TX circuitry affords flexibility in supporting multiple standards and/or frequency bands, it is also inefficient in terms of die area and cost, as the same circuitry must be replicated multiple times.

According to the present disclosure, certain components of a TX signal path may be made configurable depending on the requirements of the mode of operation to save die area and cost for a multi-standard/multi-frequency band transmitter circuit.

Figure 2:
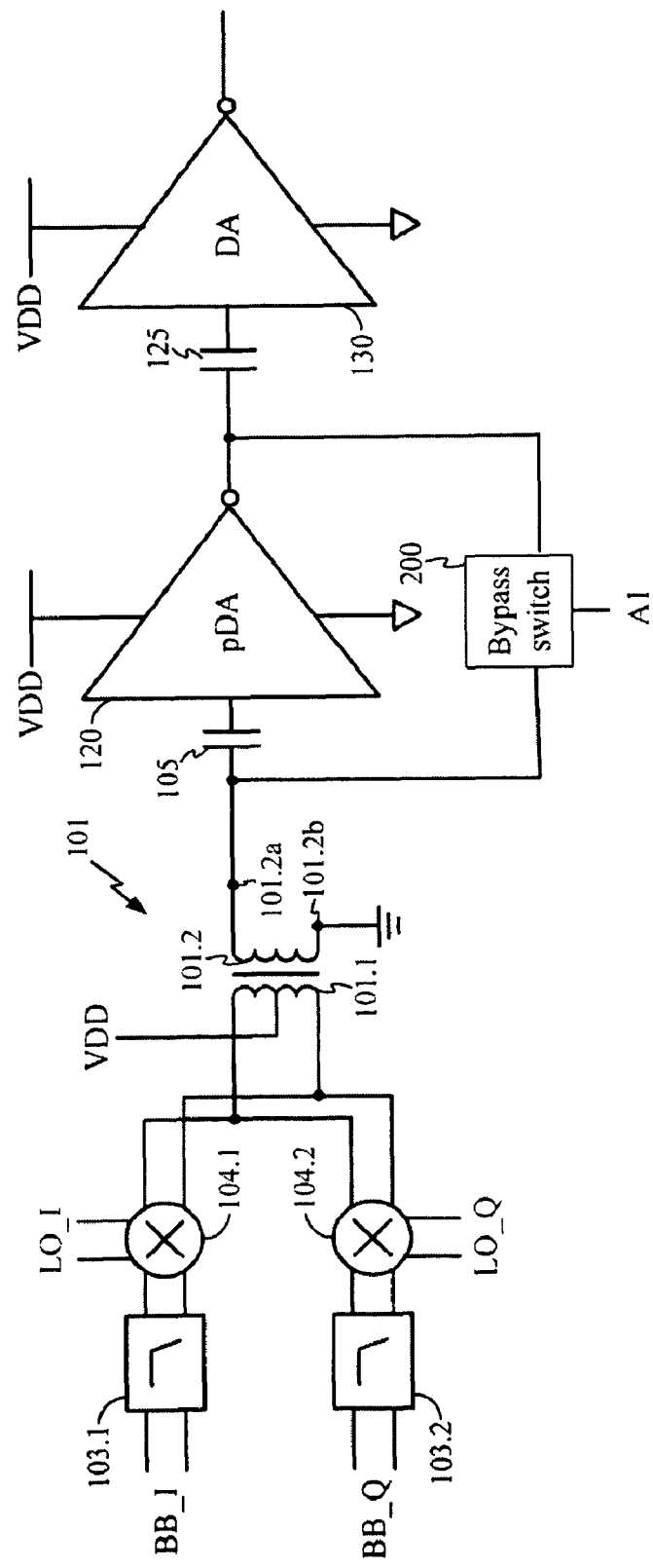
FIG. 2 depicts an embodiment of a configurable TX signal path according to the present disclosure.

FIG. 2 depicts an embodiment of a configurable TX signal path according to the present disclosure. In FIG. 2, the input and output of the pDA 120 are shunted by a bypass switch 200. The switch 200 is coupled to a control signal A1.

In one mode, by turning on the switch 200 using control signal A1, the pDA 120 can be bypassed, such that the node 101.2a of the balun 101 is directly coupled to the input of the DA 130 via capacitor 125. The bypassed-pDA mode may be advantageous during operation of the transmitter circuit according to a standard or frequency band wherein no external SAW filter is required, as earlier described with reference to FIG. 1B. In conjunction with the pDA 120 being bypassed by switch 200, the pDA 120 may also be powered down using a corresponding control signal (not shown). By disabling the pDA 120 during bypassed-pDA operation, the power that would otherwise consumed by the pDA 120 may be saved, thereby providing a configurable low-power transmitter circuit.

In an alternative mode, by turning off the switch 200 using control signal A1, the pDA 120 can be retained in the TX circuitry for operation in a mode or frequency band wherein an external SAW filter is provided, as earlier described with reference to FIG. 1B. Furthermore, in conjunction with the pDA 120 being retained in the TX signal path, the pDA 120 may be powered on using a corresponding control signal (not shown).

Figure 2A:
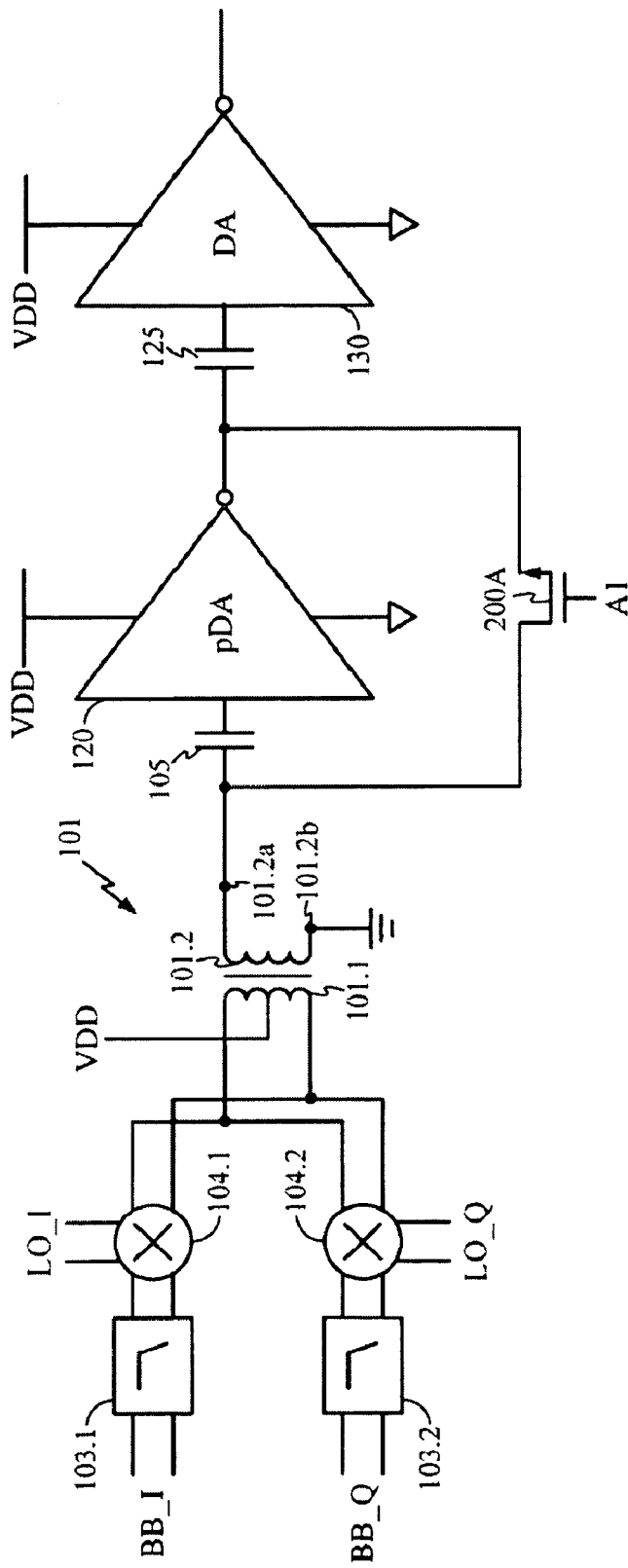
FIG. 2A depicts a specific embodiment of a bypass switch as an NMOS transistor.

FIG. 2A depicts a specific embodiment of the bypass switch 200 as an NMOS transistor 200A. In FIG. 2A, the size of the NMOS switch 200A may be chosen to balance linearity, gain, and noise considerations. For example, a larger size for the NMOS switch 200A may decrease the turn-on resistance of the switch, which is beneficial to minimize the attenuation introduced to the TX signal by the switch. However, a larger switch size may also increase the load capacitance when the switch is turned on or off, which may decrease the resonant frequency of the balun-capacitance combination at node 101.2a. A larger switch size may also decrease the reverse isolation (e.g., increase the S12 parameter) of the switch, leading to potential instability in the pDA through feedback of the output to the input. One of ordinary skill in the art will realize that the optimal size of the NMOS switch 200A may be determined through, e.g., computer circuit simulation. In an embodiment, the on-resistance introduced by the NMOS switch 200A may be less than 0.1 Ohm, while the S12 parameter of the switch may be less than −20 dB to ensure stability of the pDA. In an embodiment, the switch may be designed to meet the requisite criteria at a highest frequency of a plurality of frequency ranges over which the switch is expected to operate.

FIG. 2A is not meant to limit the scope of the present disclosure to any switch embodiment shown. One of ordinary skill in the art will appreciate that the switch 200 may be implemented in a variety of alternative ways, including as a PMOS switch, or using a topology such as a T-switch topology well-known in the art. Such alternative embodiments are contemplated to be within the scope of the present disclosure.

Figure 3:
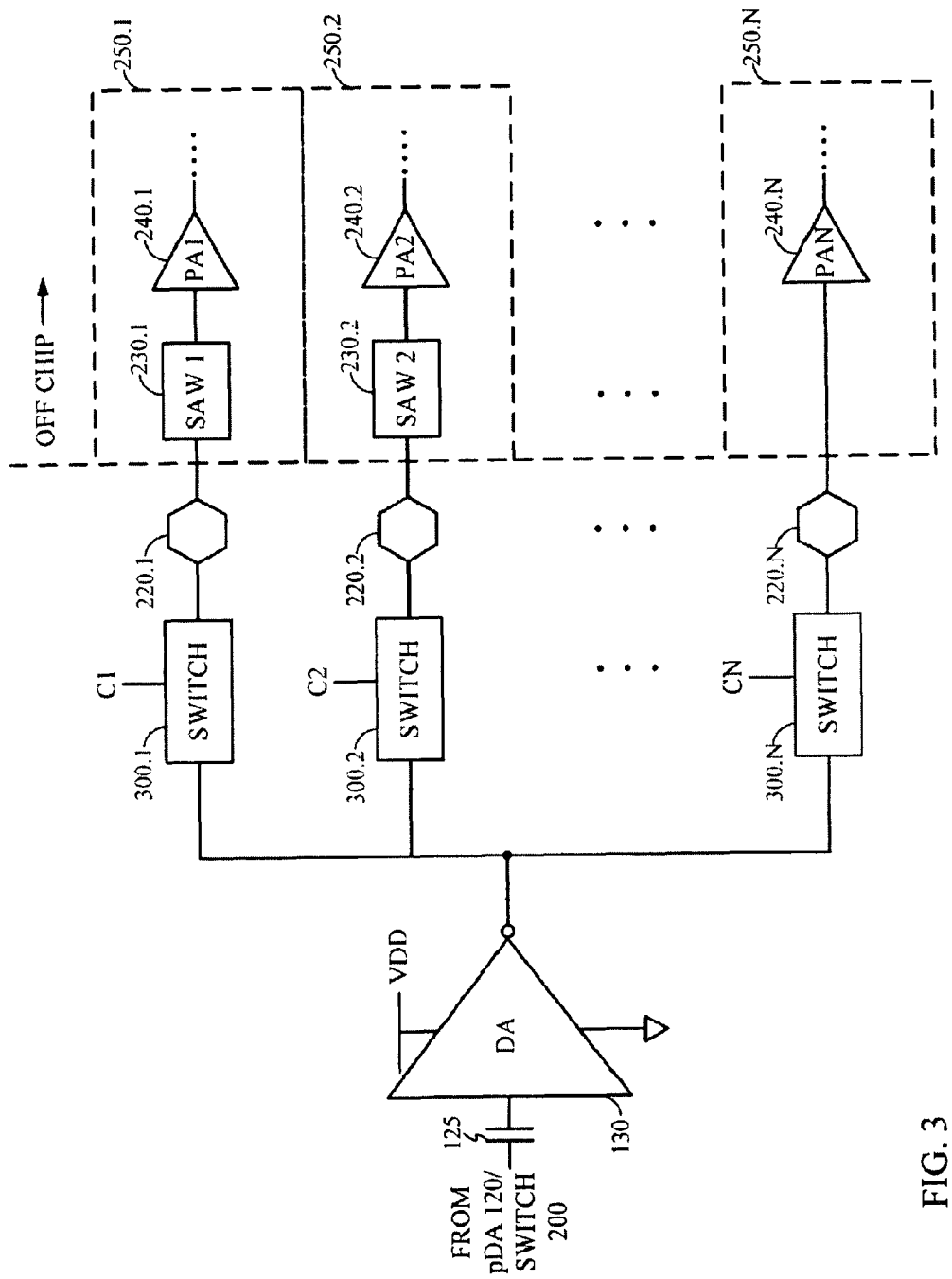
FIG. 3 depicts another aspect of the present disclosure, wherein the output of the DA 130 is coupled to a plurality of selectable off-chip connections, each off-chip connection coupling the TX circuitry to a different set of off-chip components.

FIG. 3 depicts another aspect of the present disclosure, wherein the output of the DA 130 is coupled to a plurality of selectable off-chip connections, each off-chip connection coupling the TX circuitry to a different set of off-chip components. In FIG. 3, a first off-chip connection 220.1 is coupled to the output of DA 130 by selection circuitry including a switch 300.1. Similarly, the second through N-th off-chip connections 220.2 through 220.N are coupled to the output of DA 130 by selection circuitry including switches 300.2 through 300.N, respectively. Each of switches 300.1 through 300.N is coupled to a control signal C1 through CN, respectively, to selectively turn on or off each corresponding switch. In FIG. 3, the parameter N may be an arbitrary number specific to the number of distinct sets of off-chip components supported in a specific embodiment of the present disclosure.

In FIG. 3, each off-chip connection 220.1 through 220.N is coupled to an individual set of off-chip components 250.1 through 250.N, respectively. In an embodiment, each set of off-chip components 250.1 through 250.N may include off-chip circuitry designed for operation according to, e.g., a different wireless standard, mode of operation, frequency band, etc. For example, off-chip components 250.1 include an external SAW filter SAW1 230.1 coupled to a power amplifier PA1 240.1, while off-chip components 250.N include a power amplifier PAN 240.N and no SAW filter. One of ordinary skill in the art will realize that any number N of off-chip connections may be coupled to the DA output according to the present disclosure. One of ordinary skill in the art will also realize that a set of off-chip components may further include components not shown in FIG. 3, e.g., other filters, antennas, matching networks, etc.

Figure 3A:
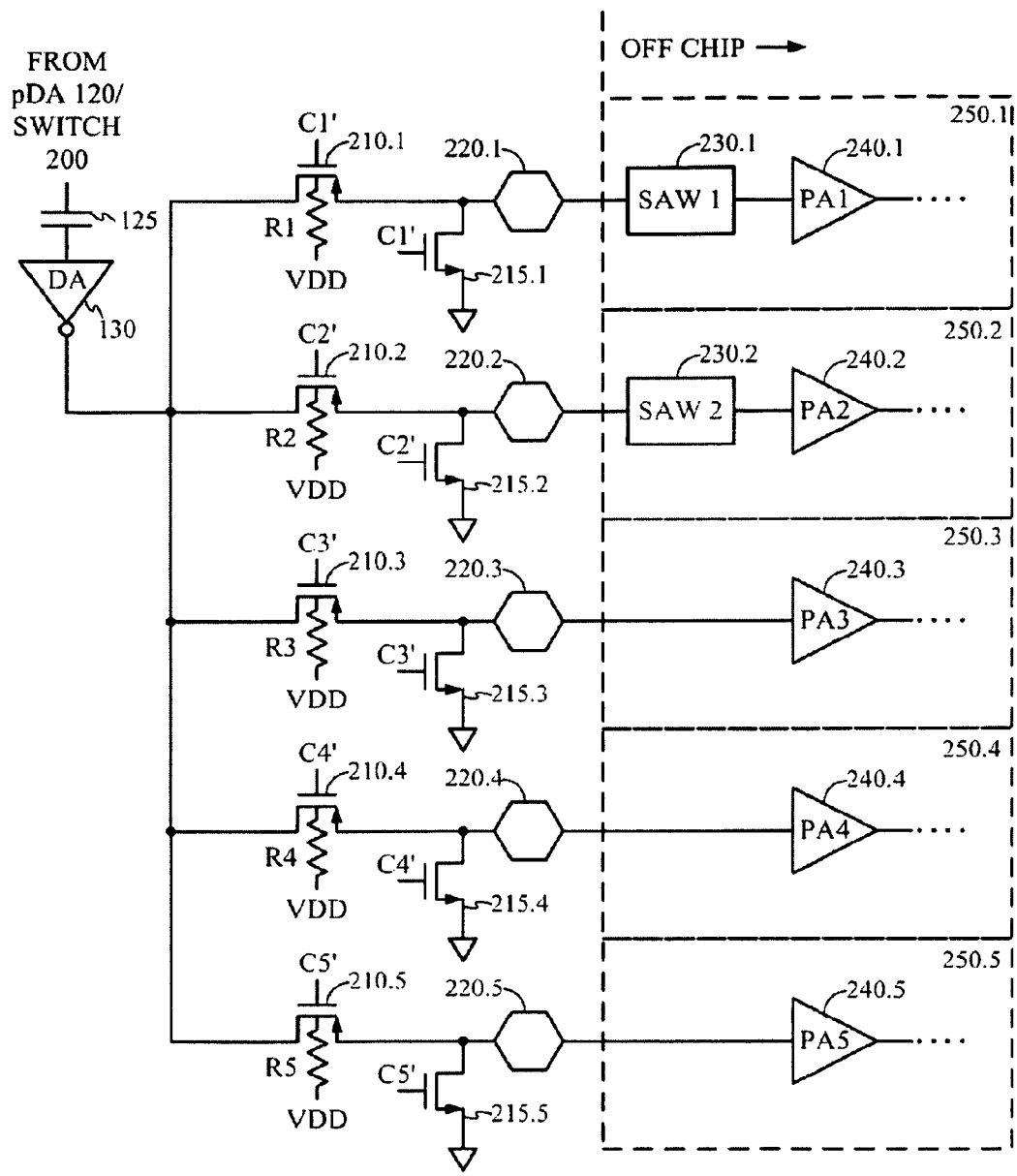
FIG. 3A depicts an embodiment of the techniques described with reference to FIG. 3, featuring a specific implementation of the switches coupled to the plurality of selectable off-chip connections.

FIG. 3A depicts an embodiment of the techniques described with reference to FIG. 3, featuring a specific implementation of switches coupled to five selectable off-chip connections. Note the embodiment shown in FIG. 3A is for illustrative purposes only, and is not meant to limit the techniques of the present disclosure to any particular number of off-chip connections, switches, or configurable modes shown.

In FIG. 3A, the selection circuitry includes a PMOS switch 210.1 coupling the DA output to the off-chip connection 220.1, and an NMOS grounding switch 215.1 coupling the off-chip connection 220.1 to ground. Off-chip connections 220.2 through 220.5 similarly have corresponding selection circuitry. Note the switches 210.1 through 210.5 are selectively turned on or off by setting corresponding control signals C1' through C5' (which represent signals complementary in polarity to the control signals C1 through CN depicted in FIG. 3). For example, to selectively couple the output of the DA 130 to off-chip connection 220.1, the PMOS switch 210.1 is turned on, and the PMOS switches 210.2 through 210.5 are turned off. Similarly, the NMOS grounding switch 215.1 is turned off, and the NMOS grounding switches 215.2 through 215.5 are turned on. By selectively enabling only one of the off-chip connections at any time, the output of the DA 130 may be multiplexed among multiple sets of off-chip components, without excessively loading the output of the DA 130.

To reduce the insertion loss of switches 210.1 through 210.5, resistors R1 through R5 may be provided to couple the bulks of the PMOS transistors to the supply voltage VDD. In an embodiment, the switches 210.1 through 210.5 may be high-voltage, thick-oxide PMOS transistors. The control voltages C1' through C5' may have a higher voltage level in the OFF state than the corresponding voltage level of the supply voltage VDD of the driver amplifier (DA) 130. This may be advantageous when the output voltage of the DA 130 swings above VDD, e.g., in a DA circuit employing an inductor-loaded common-source amplifier topology.

In FIG. 3A, the sizes of the PMOS switches 210.1 through 210.5 may be chosen to balance linearity, gain, and noise considerations. For example, smaller device sizes lead to better isolation between the multiple off-chip connections, but higher insertion loss. On the other hand, larger device sizes lead to lower insertion loss, but worse isolation. The sizes of the switches may be chosen in consideration of the factors described with reference to the NMOS switch 200A in FIG. 2A. One of ordinary skill in the art will realize that the optimal sizes of the PMOS switches 210.1 through 210.5 may be determined through, e.g., computer circuit simulation.

One of ordinary skill in the art will appreciate that the switches 300.1 through 300.N depicted in FIG. 3 may be implemented using alternative switch types and architectures not shown in FIG. 3A. For example, in an alternative embodiment, thick-oxide NMOS transistors may be used in place of the PMOS transistors 210.1 through 210.5 shown in FIG. 3A. In such an embodiment, the output of the DA, 130 may be coupled to each NMOS switch transistor through corresponding AC-coupling capacitors (not shown). Such alternative switch implementations are contemplated to be within the scope of the present disclosure.

FIG. 4 shows an example of possible configuration settings for the transmitter circuitry depicted in FIGS. 2 and 3. According to setting #1, control signal A1 is LO, a pDA enable signal pDA EN (such as EN1 in FIG. 1A) is HI, and the off-chip connection corresponding to C1 is turned on. In this setting, the pDA 120 is active, an external SAW filter SAW1 230.1 is coupled to the DA output, and the SAW-filtered output is provided to power amplifier PA1 240.1. The TX signal path corresponding to setting #1 is seen to have the same characteristics as the TX signal path depicted in FIG. 1B. The TX signal path corresponding to setting #1 may be used to support, e.g., TX operation according to the WCDMA standard at a 900 MHz frequency range of operation, as listed under the column "Example mode."

According to setting #2, control signal A1 is HI, pDA EN is LO, and the off-chip connection corresponding to C2 is turned on. In this setting, the pDA 120 is bypassed, external SAW filter SAW2 230.2 is provided, and the filtered output is provided to power amplifier PA2 240.2. The TX signal path corresponding to setting #2 may be used to support, e.g., TX operation according to the CDMA 1× and/or LTE (Long-Term Evolution) standards at a 700 MHz frequency range of operation.

According to setting #3, control signal. A1 is HI, pDA EN is LO, and the off-chip connection corresponding to C3 is turned on. In this setting, the pDA 120 is bypassed, no external SAW filter is provided, and the DA output is directly coupled to power amplifier PA3 240.3. The TX signal path corresponding to setting #3 is seen to have the same characteristics as the TX signal path depicted in FIG. 1C. The TX signal path corresponding to setting #3 may be used to support, e.g., TX operation according to the GSM/EDGE standard.

According to setting #4, control signal A1 is HI, pDA EN is LO, and the off-chip connection corresponding to C'4 is turned on. In this setting, the pDA 120 is bypassed, no external SAW filter is provided, and the DA output is directly coupled to power amplifier PA4 240.4. The TX signal path corresponding to setting #4 is seen to have the same characteristics as the TX signal path depicted in FIG. 1C. The TX signal path corresponding to setting #4 may be used to support, e.g., TX operation according to the CDMA 1× standard.

According to setting #5, control signal A1 is LO, pDA EN is HI, and the off-chip connection corresponding to C5 is turned on. In this setting, the pDA 120 is active, no external SAW filter is provided, and the DA output is directly coupled to power amplifier PA5 240.5. The TX signal path corresponding to setting #5 may be used to support, e.g., TX operation according to the WCDMA standard at PCS (Personal Communications Service) frequencies.

By selecting configuration settings such as shown in FIG. 4, the transmitter architecture depicted in FIGS. 2 and 3 allows multi-mode/multi-band operation using a single instance of transmitter circuitry, while providing multiple off-chip connections for multi-standard and roaming applications.

Figure 5:
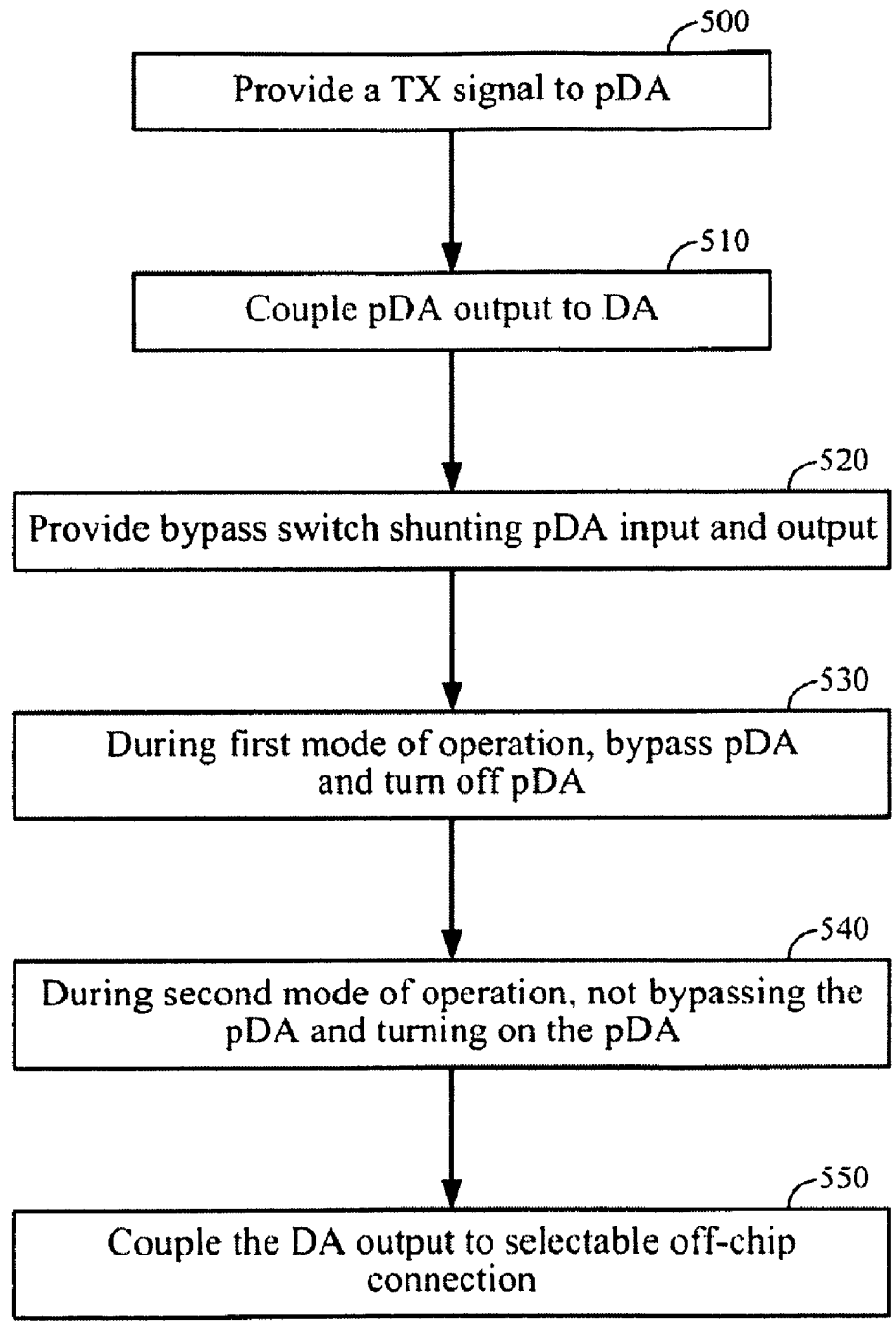
FIG. 5 depicts an embodiment of a method according to the present disclosure.

FIG. 5 depicts an embodiment of a method according to the present disclosure. Note the embodiment shown in FIG. 5 is meant to be illustrative only, and is not meant to limit the scope of the present disclosure to any particular embodiment shown. Furthermore, the order of the steps shown in FIG. 5 should not be construed as limiting the techniques disclosed to any particular sequence of steps.

In FIG. 5, at step 500, a TX signal is provided to the input of a pDA. At step 510, the pDA output is coupled to the input of a DA. At step 520, a bypass switch shunting the pDA input and pDA output is provided. At step 530, during a first mode of operation, the pDA is bypassed by the bypass switch, and the pDA is turned off. At step 540, during a second mode of operation, the pDA is not bypassed, and turned on. At step 550, the DA output is selectively coupled to at least one of a plurality of off-chip connections for further processing, as previously disclosed herein.

Based on the teachings described herein, it should be apparent that an aspect disclosed herein may be implemented independently of any other aspects and that two or more of these aspects may be combined in various ways. In one or more exemplary embodiments, the functions described may be implemented in hardware, software, firmware, or any combination thereof. If implemented in software, the functions may be stored on or transmitted over as one or more instructions or code on a computer-readable, medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. A method for configuring a transmitter for a communications device, the method comprising:
   providing a transmit (TX) signal to the input of a pre-driver amplifier (pDA), the pDA having a pDA output, the pDA selectively turned on and off by a pDA control signal;
   coupling the pDA output to the input of a driver amplifier (DA), the DA having a DA output;
   providing a bypass switch shunting the pDA input and the pDA output, the bypass switch controlled by a bypass control signal;
   during a first mode of operation, setting the bypass control signal to turn on the bypass switch, and setting the pDA control signal to turn off the pDA; and
   during a second mode of operation, setting the bypass control signal to turn off the bypass switch, and setting the pDA control signal to turn on the pDA.

2. The method of claim 1, the bypass switch comprising an NMOS transistor.

3. The method of claim 1, the second mode of operation comprising further filtering the output of the DA using an external SAW filter.

4. The method of claim 1, the setting the pDA control signal to turn off the pDA comprising turning off a pDA switch transistor coupling the pDA to a voltage supply, the setting the pDA control signal to turn on the pDA comprising turning on the pDA switch transistor.

5. The method of claim 4, the pDA switch transistor being a PMOS transistor.

6. The method of claim 5, the pDA comprising a common-source cascoded amplifier stage, the common-source cascaded amplifier stage coupled to an inductor load, the pDA switch transistor coupling the inductor load to a voltage supply.

7. The method of claim 6, the TX signal, coupled to the input of the common-source cascoded amplifier stage via a first coupling capacitor, the output of the common-source cascoded amplifier stage coupled to the DA via a second coupling capacitor.

8. The method of claim 1, the TX signal generated by a single-ended element of a balun, the single-ended element of the balun coupled to a differential element of the balun, the differential element of the balun coupled to upconverting mixers.

9. The method of claim 1, further comprising:
   coupling the DA output to a plurality of selectable off-chip connections, each off-chip connection coupling the DA output to a set of off-chip components, each off-chip connection comprising a corresponding off-chip connection switch coupling the DA output to the corresponding off-chip connection; and
   enabling at least one of the plurality of selectable off-chip connections based on an off-chip connection control signal.

10. The method of claim 9, further comprising enabling an off-chip connection coupling the DA output to a set of off-chip components including a surface acoustic wave (SAW) filter during the second mode of operation.

11. The method of claim 10, the second mode of operation corresponding to TX operation according to the WCDMA standard at a frequency range of 900 MHz.

12. The method of claim 10, further comprising enabling an off-chip connection coupling the DA output to a set of off-chip components not including a SAW filter during the first mode of operation.

13. The method of claim 12, the first mode of operation corresponding to TX operation according to the GSM/EDGE standard.

14. The method of claim 12, the first mode of operation corresponding to TX operation according to the CDMA 1× standard.

15. The method of claim 12, the selecting at least one of the selectable off-chip connections comprising turning on a corresponding off-chip connection switch.

16. The method of claim 15, the selecting at least one of the selectable off-chip connections further comprising turning off at feast one off-chip connection switch not associated with the selected off-chip connection.

17. The method of claim 16, each off-chip connection switch comprising a PMOS transistor coupling the DA output to the corresponding off-chip connection.

18. The method of claim 17, the bulk of the PMOS transistor of each off-chip connection coupled to a source voltage via a resistor.

19. The method of claim 17, each off-chip connection further comprising an off-chip connection grounding switch coupling the off-chip connection to ground.

20. The method of claim 19, the off-chip connection grounding switch comprising an NMOS transistor.

21. The method of claim 20, the selecting at least one of the selectable off-chip connections comprising turning off a corresponding off-chip connection grounding switch.

22. The method of claim 21, the selecting at least one of the selectable off-chip connections comprising turning on at least one off-chip connection grounding switch not associated with the selected off-chip connection.

23. The method of claim 9, further comprising enabling an off-chip connection coupling the DA output to a set of off-chip components including a surface acoustic wave (SAW) filter during the first mode of operation.

24. The method of claim 23, the first mode of operation corresponding to TX operation according to the CDMA 1× or LTE standards at a frequency range of 700 MHz.

25. The method of claim 10, further comprising enabling an off-chip connection coupling the DA output to a set of off-chip components not including a SAW filter during the second mode of operation.

26. The method of claim 15, the second mode of operation corresponding to TX operation according to the WCDMA standard a PCS frequency range.

27. A transmitter apparatus for a communications device, the apparatus comprising:
a pre-driver amplifier (pDA) having a pDA input coupled to a transmit (TX) signal, the pDA having a pDA output, the pDA selectively turned on and off by a pDA control signal;
a driver amplifier (DA) having a DA input coupled to the pDA output, the DA having a DA output;
a bypass switch shunting the pDA input and the pDA output, the bypass switch controlled by a bypass control signal such that during a first mode of operation the bypass control signal is set to turn on the bypass switch and turn off the pDA, and such that during a second mode of operation the bypass control signal is set to turn off the bypass switch and turn on the pDA.

28. The apparatus of claim 27, the bypass switch comprising an NMOS transistor.

29. The apparatus of claim 27, the pDA control signal coupled to a pDA switch transistor coupling the pDA to a voltage supply.

30. The apparatus of claim 29, the pDA switch transistor being a PMOS transistor.

31. The apparatus of claim 30, the pDA comprising a common-source cascoded amplifier stage, the common-source cascoded amplifier stage coupled to an inductor load, the pDA switch transistor coupling the inductor load to a voltage supply.

32. The apparatus of claim 31, the TX signal coupled to the input of the common-source cascoded amplifier stage via a first coupling capacitor, she output of the common-source cascoded amplifier stage coupled to the DA via a second coupling capacitor.

33. The apparatus of claim 27, further comprising:
a balun comprising a single-ended element coupled to a differential element; and
upconverting mixers coupled to the balun, the differential element of the balun generating the TX signal.

34. The apparatus of claim 27, further comprising:
a plurality of selectable off-chip connections, each off-chip connection coupling the DA output to a set of off-chip components, each off-chip connection comprising a corresponding off-chip connection switch coupling the DA output to the corresponding off-chip connection, wherein an off-chip connection control signal turns on at least one of the plurality of selectable off-chip connections.

35. The apparatus of claim 34, an off-chip connection coupling the DA output to a set of off-chip components including a SAW filter during a second mode of operation.

36. The apparatus of claim 34, an off-chip connection coupling the DA output to a set of off-chip components not including a SAW filter during a first mode of operation.

37. The apparatus of claim 34, each off-chip connection switch comprising a PMOS transistor coupling the DA output to the corresponding off-chip connection.

38. The apparatus of claim 37, each off-chip connection further comprising an off-chip connection grounding switch coupling the off-Chip connection to ground.

39. The apparatus of claim 37, the bulk of the PMOS transistor of each off-chip connection coupled to a source voltage via a resistor.

40. A transmitter apparatus for a communications device, the apparatus comprising:
a pre-driver amplifier (pDA) having a pDA input coupled to a transmit (TX) signal, the pDA having a pDA output, the pDA selectively turned on and off by a pDA control signal;
a driver amplifier (DA) having a DA input coupled to the pDA output, the DA having a DA output; and
means for bypassing the pDA and turning off the PDA during a first mode of operation, and not bypassing the pDA and turning on the PDA during a second mode of operation.

41. The apparatus of claim 40, further comprising means for selectively coupling the DA output to one of a plurality of off-chip connections.

42. A method for configuring a transmitter for a communications device, the method comprising:
providing a transmit (TX) signal to the input of a driver amplifier (DA), the DA having a DA output;
coupling the DA output to a plurality of selectable off-chip connections, each off-chip connection coupling the DA output to a set of off-chip components, each off-chip connection comprising a corresponding off-chip connection switch coupling the DA output to the corresponding off-chip connection; and
enabling at least one of the plurality of selectable off-chip connections based on an off-chip connection control signal.

43. The method of claim 42, the coupling the DA output to a plurality of selectable off-chip connections comprising:
coupling the DA output to the drains of a plurality of thick-oxide PMOS devices, the source of each PMOS device coupled to a corresponding one of the plurality of selectable off-chip connections; the enabling at least one of the plurality of selectable off-chip connections comprising:
providing a low voltage level to the gate of the PMOS device corresponding to the enabled selectable off-chip connection; and
providing a high voltage level to the gates of the PMOS devices corresponding to the selectable off-chip connections not enabled.

44. The method of claim 43, further comprising:
coupling each of the plurality of selectable off-chip connections to the drain of a corresponding NMOS device, the source of each NMOS device being coupled to a ground voltage; the enabling at least one of the plurality of selectable off-chip connections comprising:
providing a low voltage level to the gate of the NMOS device corresponding to the enabled selectable off-chip connection; and
providing a high voltage level, to the gates of the NMOS device corresponding to the selectable off-chip connections not enabled.

45. The method of claim 42, the coupling the DA output to a plurality of selectable off-chip connections comprising:
coupling the DA output to the drains of a plurality of thick-oxide NMOS devices via corresponding AC-coupling capacitors, the source of each NMOS device coupled to a corresponding one of the plurality of selectable off-chip connections; the enabling at least one of the plurality of selectable off-chip connections comprising:

providing a high voltage level to the gate of the NMOS device corresponding to the enabled selectable off-chip connection; and providing a low voltage level to the gates of the NMOS devices corresponding to the selectable off-chip connections not enabled.

46. A transmitter apparatus for a communications device, the apparatus comprising:

a driver amplifier (DA) having a DA output;

a plurality of selectable off-chip connections, each off-chip connection coupling the DA output to a set of off-chip components, each off-chip connection comprising a corresponding off-chip connection switch coupling the DA output to the corresponding off-chip connection, wherein an off-chip connection control signal turns on at least one of the plurality of selectable off-chip connections.

47. A method for configuring a transmitter, comprising:

in a first mode of operation, setting a bypass control signal to turn on a bypass switch and setting a pre-driver (pDA) control signal to turn off a pDA, wherein a transmit (TX) signal is provided to an input of the pDA, the pDA having an output that is coupled to an input of a driver amplifier (DA), wherein the bypass switch is coupled between the pDA input and the pDA output; and in a second mode of operation, setting the bypass control signal to turn off the bypass switch and setting the pDA control signal to turn on the pDA.

48. A method for configuring a transmitter, comprising:

in a first mode enabling a first of a plurality of selectable off-chip connections and disabling a second of the plurality of selectable off-chip connections, wherein a transmit (TX) signal is provided to an input of a driver amplifier (DA), the DA having a DA output that is coupled to the plurality of selectable off-chip connections, each off-chip connection comprising a switch coupling the DA output to the corresponding off-chip connection; and in a second mode enabling the second of the plurality of selectable off-chip connections and disabling the first of the plurality of selectable off-chip connections.

* * * * *